(12) United States Patent
Inoue et al.

(10) Patent No.: US 6,376,099 B1
(45) Date of Patent: Apr. 23, 2002

(54) CU-CONTAINING NB₃A1 MULTIFILAMENTARY SUPERCONDUCTIVE WIRE AND PROCESS FOR PRODUCING THE SAME

(75) Inventors: Kiyoshi Inoue; Yasuo Iijima; Akihiro Kikuchi, all of Ibaraki (JP)

(73) Assignee: Agency of Industrial Science and Technology National Research Institute for Metals, Tsukuba (JP)

( * ) Notice: Subject to any disclaimer, the term of this patent is extended or adjusted under 35 U.S.C. 154(b) by 0 days.

(21) Appl. No.: 09/708,409

(22) Filed: Nov. 9, 2000

(51) Int. Cl.⁷ .............................. H01B 12/10; C22F 1/16

(52) U.S. Cl. ..................... 428/615; 148/98; 148/527; 148/668; 428/660; 428/662; 428/674; 428/375; 428/378; 428/930; 505/919

(58) Field of Search .................... 428/615, 660, 428/662, 674, 375, 378, 379, 389, 396, 930; 148/527, 668, 98; 505/919

(56) References Cited

FOREIGN PATENT DOCUMENTS

EP    0 528 036 A1  *  2/1993  .......... H01B/13/00

* cited by examiner

Primary Examiner—Robert R. Koehler
(74) Attorney, Agent, or Firm—Wenderoth, Lind & Ponack, L.L.P.

(57) ABSTRACT

A Cu-containing Nb₃Al multifilamentary superconductive wire having a multifilamentary (superfine multi-core structure that a large number of micro-complex cores each obtained by complexing a Cu—Al alloy containing Cu in an amount of more than 0.2 at. % and at most 10 at. % in Nb are embedded in Nb, Ta, an Nb alloy or a Ta alloy as a matrix, wherein in the micro-complex cores, an A15 phase compound structure is formed by rapid heating at a temperature of 1,700° C. or more for 2 seconds or less and quenching to approximately room temperature, and further additionally heat-treated at a temperature of 650 to 900° C. This superconductive wire has high Jc in a low magnetic field, can be applied to all magnetic fields of 29 T or less, and is excellent in Jc characteristics in a high magnetic field in comparison with an Nb₃Al wire.

8 Claims, 13 Drawing Sheets

CU-CONTAINING NB$_3$Al
MULTIFILAMENTARY SUPERCONDUCTIVE
WIRE AND PROCESS FOR PRODUCING
THE SAME

FIELD OF THE INVENTION

The present invention relates to a Cu-containing Nb$_3$Al multifilamentary superconductive wire and process for producing the same. More specifically, it relates to a Cu-containing Nb$_3$Al multifilamentary superconductive wire which can be applied to generation of all magnetic fields of approximately 29 T or less, and a process for producing the same.

DESCRIPTION OF THE RELATED ART

Figure 1:
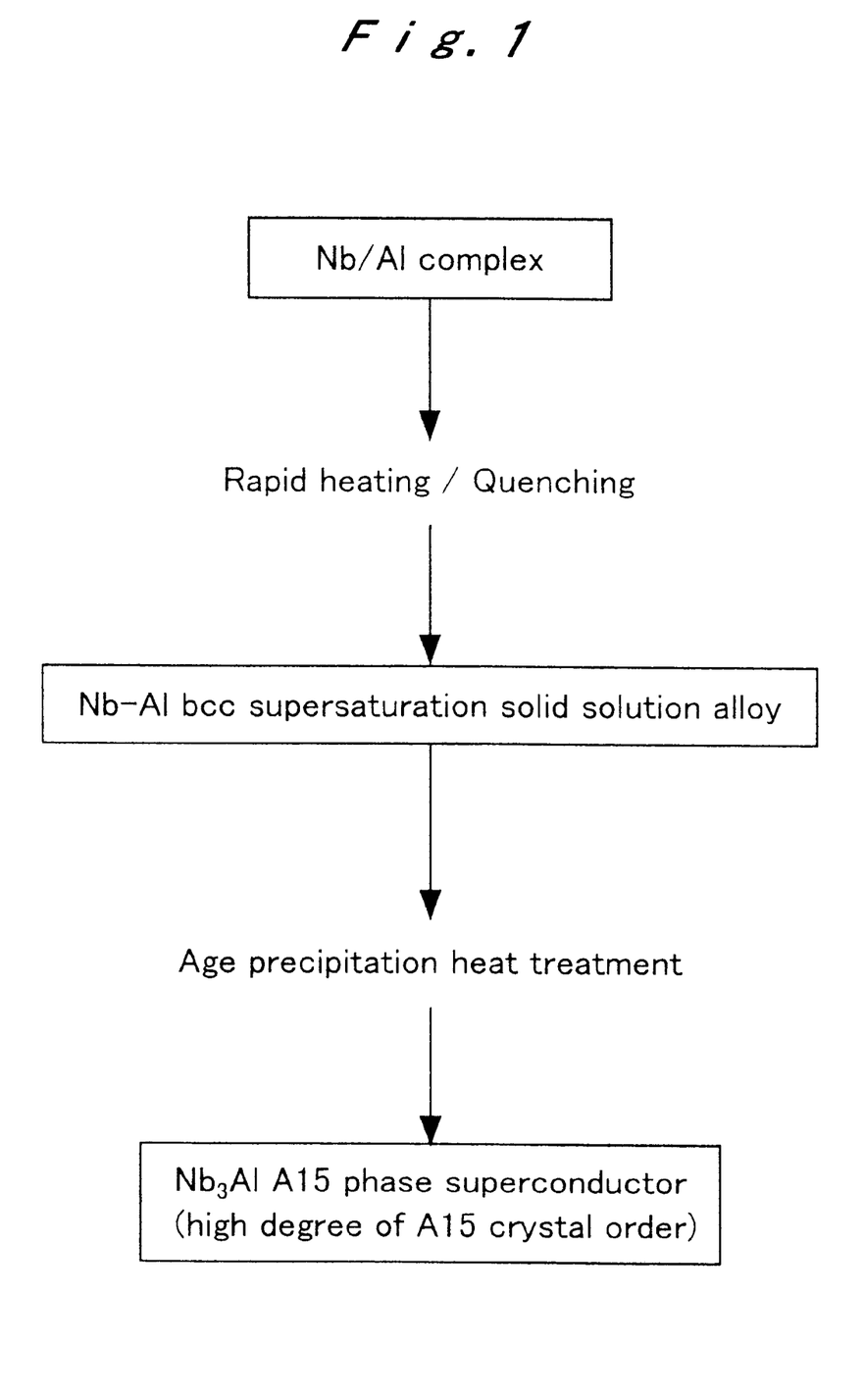
FIG. 1 is a flow chart showing production of an NB$_3$Al wire by a rapid heating/quenching and transformation method.

To alloy superconductors, an Nb—Ti wire has been so far actually used for a low magnetic field of up to 9 T (tesla) at 4.2 K, and an Nb$_3$Sn or V$_3$Ga wire for a high magnetic field of 9 to 21 T. On the other hand, an Nb$_3$Al superconductive wire produced by a rapid heating/quenching and transformation method has been expected to be put to practical use by studies in recent years. Since this wire exhibits Jc which is three to five times as high as Jc of existing actual superconductive wires, the performance of superconductive application instruments such as a high magnetic field NMR spectrometer, a fusion reactor, a superconductive particle accelerator and SMES can be improved to a great extent. Accordingly, there is a possibility that it replaces the existing actual superconductive wires. FIG. 1 shows a flow chart of producing an Nb$_3$Al wire by a rapid heating/quenching and transformation method. In this case, the rapid heating/quenching and transformation method is a method which comprises subjecting an Nb/Al superfine complex wire as a precursor wire to rapid heating and quenching to first form directly an Nb—Al bcc supersaturation solid solution in the wire, then conducting additional heat treatment at approximately 800° C., and converting the bcc supersaturation solid solution formed into an A15 phase compound to produce a superconductive wire having quite high Jc characteristics (Japanese Patent Registration No. 2021986).

Figure 2:
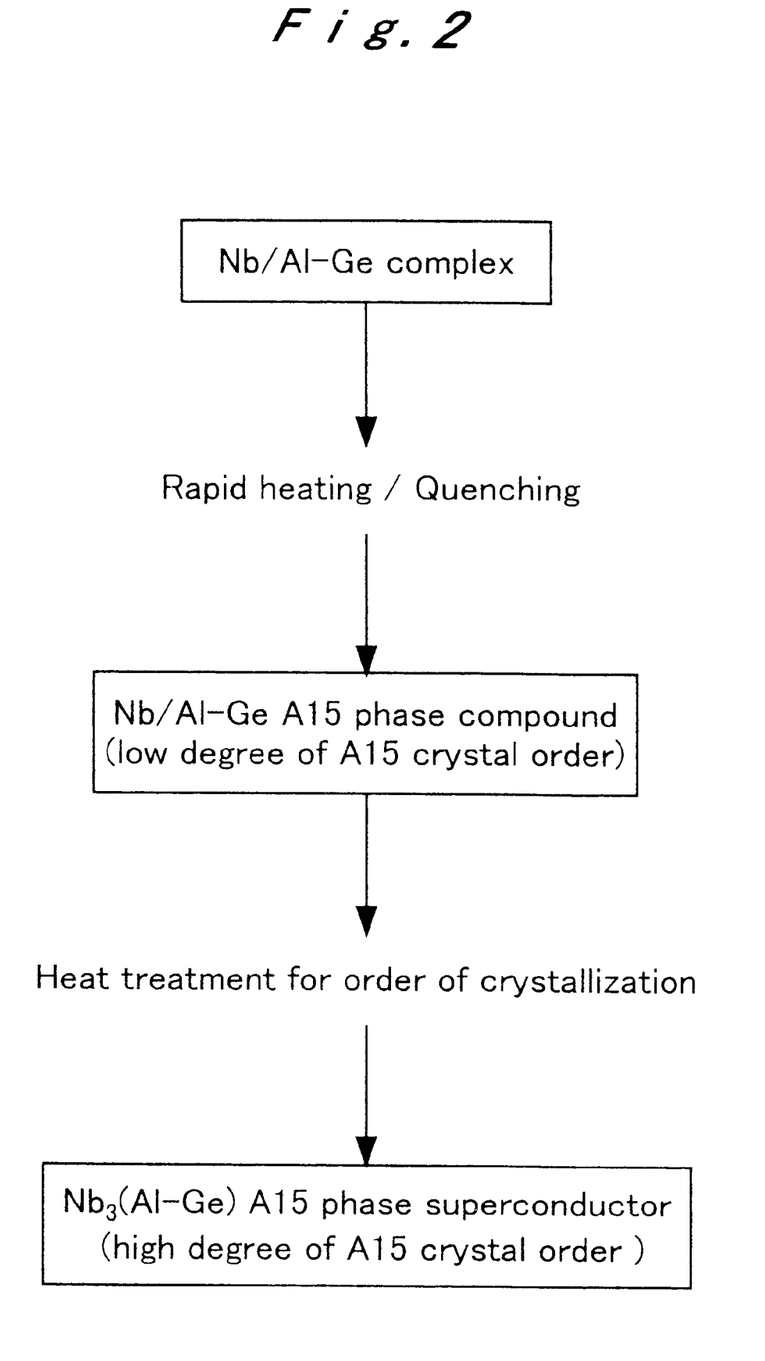
FIG. 2 is a flow chart showing production of an Nb$_3$(Al, Ge) wire by a rapid heating/quenching method.

Further, the present invention have proposed the similar method of producing the superconductive wire which comprises, as shown in FIG. 2, subjecting a precursor complex wire obtained with Ge or Si-containing Al alloy to rapid heating and quenching to first form directly Nb$_3$(Al, Ge) as an A15 phase compound having a low degree of crystal long-range order, then heat-treating the same at approximately 800° C. to restore the crystal long-range order and obtain the Nb$_3$(Al, Ge) superconductive wire as the A15 phase compound. In the Nb$_3$(Al, Ge) superconductive wire obtained by this method, Tc and Hc$_2$ (4.2 K) are greatly improved and Jc in a high magnetic field is high. Accordingly, the development of this wire as a superconductive wire for generation of a superhigh magnetic field of 23 to 29 T has proceeded (Japanese Patent Application No. 59907/1999). However, in this superconductive wire, Jc in the low magnetic field is not so high. Therefore, considering economics, it has to be used in combination with other superconductive wires having excellent characteristics in the low magnetic field.

SUMMARY OF THE INVENTION

A problem of the invention is to provide a superconductive wire which is free from a defect that Jc is low in a low magnetic field and which can be applied to generation of all magnetic fields of approximately 29 T or less and a process for producing the same. Another problem of the invention is to provide a superconductive wire having excellent Jc characteristics in a high magnetic field in comparison with an Nb$_3$Al wire.

In order to solve these problems, the invention provides the following.

That is, the invention first provides a Cu-containing Nb$_3$Al multifilamentary superconductive wire having a multifilamentary (superfine multi-core) structure that a large number of micro-complex cores each obtained by complexing a Cu—Al alloy containing Cu in an amount of more than 0.2 at. % and at most 10 at. % in Nb are embedded in Nb, Ta, and Nb alloy or a Ta alloy as a matrix, wherein in the micro-complex cores, an A15 phase compound structure is formed by rapid heating at a temperature of 1,700° C. or more for 2 seconds or less and quenching to approximately room temperature, and further additionally heat-treated at a temperature of 650 to 900° C. The invention second provides the superconductive wire of the first invention, wherein in the micro-complex cores, the Cu—Al alloy complexed in Nb has an average diameter of 1 μm or less. The invention third provides the superconductive wire of the first invention, wherein the Cu—Al alloy complexed in Nb has a volume ratio to Nb of 1:2.5 to 1:3.5 in terms of a Cu—Al alloy:Nb ratio. The invention fourth provides the superconductive wire of any one of the first to third inventions, wherein Cu for stabilization is coated as an outermost layer. The invention fifth provides the superconductive wire of any one of the first to third inventions, wherein Cu for stabilization surrounded by a diffusion barrier layer made of Nb or Ta is mounted in the matrix. The invention sixth provides a process for producing the Cu-containing Nb$_3$Al multifilamentary superconductive wire of any one of the first to third inventions, wherein the wire having the multifilamentary (superfine multi-core) structure is made to have a temperature of 1,700° C. or more by rapid heating for 2 seconds or less, then quenched to approximately room temperature and thereafter additionally heat-treated at a temperature of 650 to 900° C. The invention seventh provides the process of the sixth invention, wherein before or after the additional heat treatment, Cu for stabilization is coated on the surface of the wire. The invention eighth provides the process of the sixth invention, wherein before the rapid heating, Cu for stabilization surrounded by a diffusion barrier layer made of Nb or Ta is mounted in the matrix.

BEST MODE FOR CARRYING OUT THE INVENTION

The invention is described in more detail below.

First of all, the superconductive wire provided by the first invention is specified by the following requirements.

(1) It has a multifilamentary (superfine multi-core) structure that a large number of micro-complex cores are embedded in Nb, Ta, an Nb alloy or a Ta alloy as a matrix, (2) said micro-complex core is obtained by complexing a Cu—Al alloy containing Cu in an amount of more than 0.2 at. % and at most 10 at. % in Nb, and (3) in the micro-complex cores in (2), an A15 phase compound structure is formed by rapid heating at a temperature of 1,700° C. or more for 2 seconds or less and quenching to approximately room temperature, and further additionally heat-treated at a temperature of 650 to 900° C.

According to the second invention, the Cu—Al alloy in the requirement (1) has preferably an average outer diameter or 1 μm or less. According to the third invention, the volume ratio of Cu—Al alloy to Nb is preferably 1:2.5 to 1:3.5. The definition of "a large number" means several tens to several millions. The definition of "approximately room temperature" means a temperature range of approximately 15° C. to approximately 50° C.

Further, the fourth invention is characterized by the Cu-containing $Nb_3Al$ multifilamentary superconductive wire in which Cu for stabilization is coated as the outermost layer. According to the fifth invention, Cu for stabilization surrounded by the diffusion barrier layer made of Nb or Ta is preferably mounted in the matrix.

Cu here plays a part of stabilizing a state in which a current is passed through a superconductive wire. That is, generally, when a current is passed through a superconductive wire, it starts to flow from the surface of the wire, and does not flow uniformly. Thus, an unstable state in which energy is stored in the wire occurs, and the wire is mutually rubbed or moved. Consequently, energy in the wire is locally released to partially destroy superconductivity and generate Joule heat. Thus, the destruction of the superconductive state is spread throughout the wire. However, when high-quality Cu is coated on the wire, a current is selectively passed through the high-purity Cu portion in a part where the superconduction is destroyed (normal conduction part), so that no great heat generation occurs. During that time, the wire is cool ed from the surroundings, and the normal conduction part comes to have superconductivity again. Thus, the superconductive state is kept stable by the Cu coating.

The sixth to eighth inventions are provided with respect to the process for producing the superconductive wire.

Figure 3:
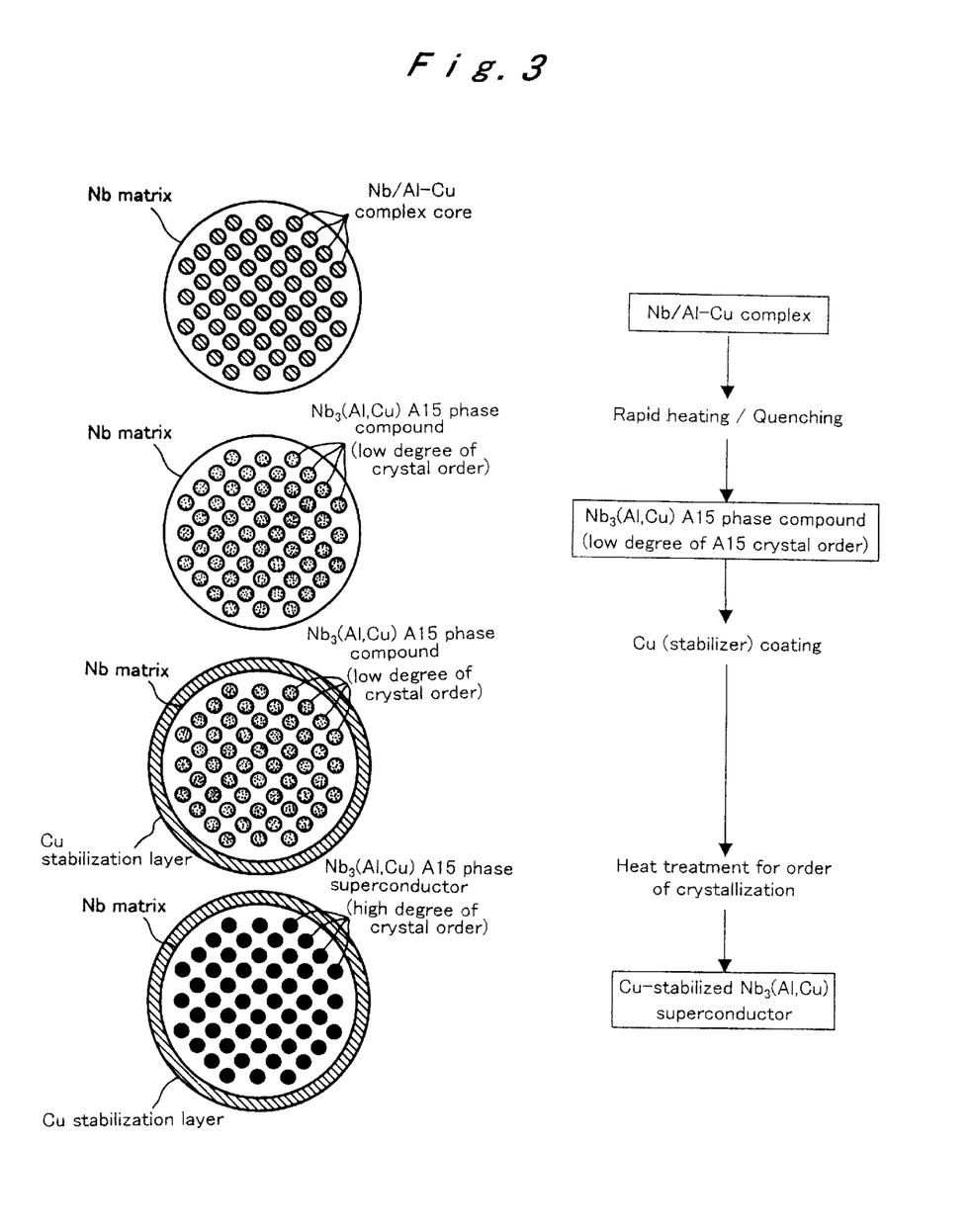
FIG. 3 is a flow chart showing a process of the invention in which Cu for stabilization is coated before additional heat treatment.

In the superconductive wire coated with Cu for stabilization in the invention, for example, the structure and the process shown in FIG. 3 are described. In the process, as described in the sixth invention, the wire having the multifilamentary (superfine multi-core) structure is made to have a temperature of 1,700° C. or more by rapid heating for 2 seconds or less, then quenched to approximately room temperature and thereafter additionally heat-treated (in FIG. 3, heat treatment for order of crystallization) at a temperature of 650 to 900° C. And, Cu for stabilization is coated on the surface of the wire before the additional heat treatment. Meanwhile, FIG. 4, unlike FIG. 3, shows a process in which Cu for stabilization is coated on the surface of the wire after the additional heat treatment.

Figure 5:
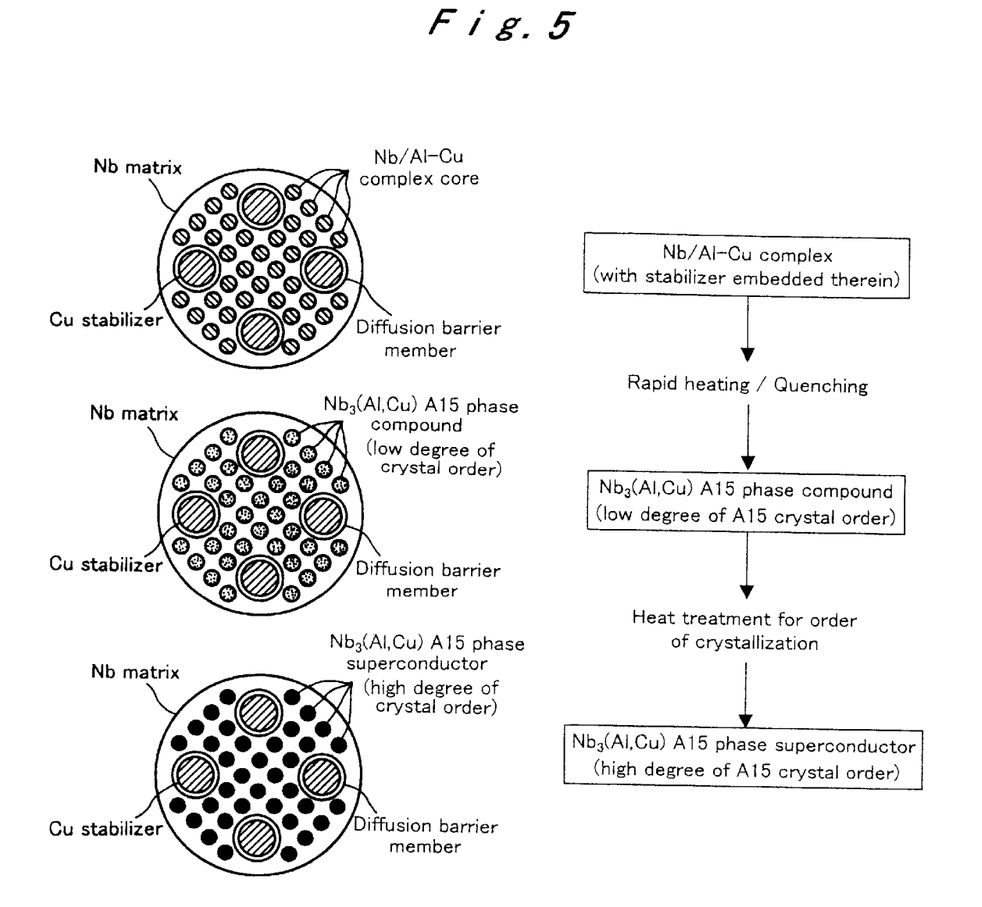
FIG. 5 is a flow chart showing the process of the invention in which Cu for stabilization is mounted in a matrix before rapid heating.

Further, in FIG. 5, before the additional heat treatment, Cu for stabilization surrounded by a diffusion barrier layer made of Nb or Ta is mounted in a matrix.

Figure 4:
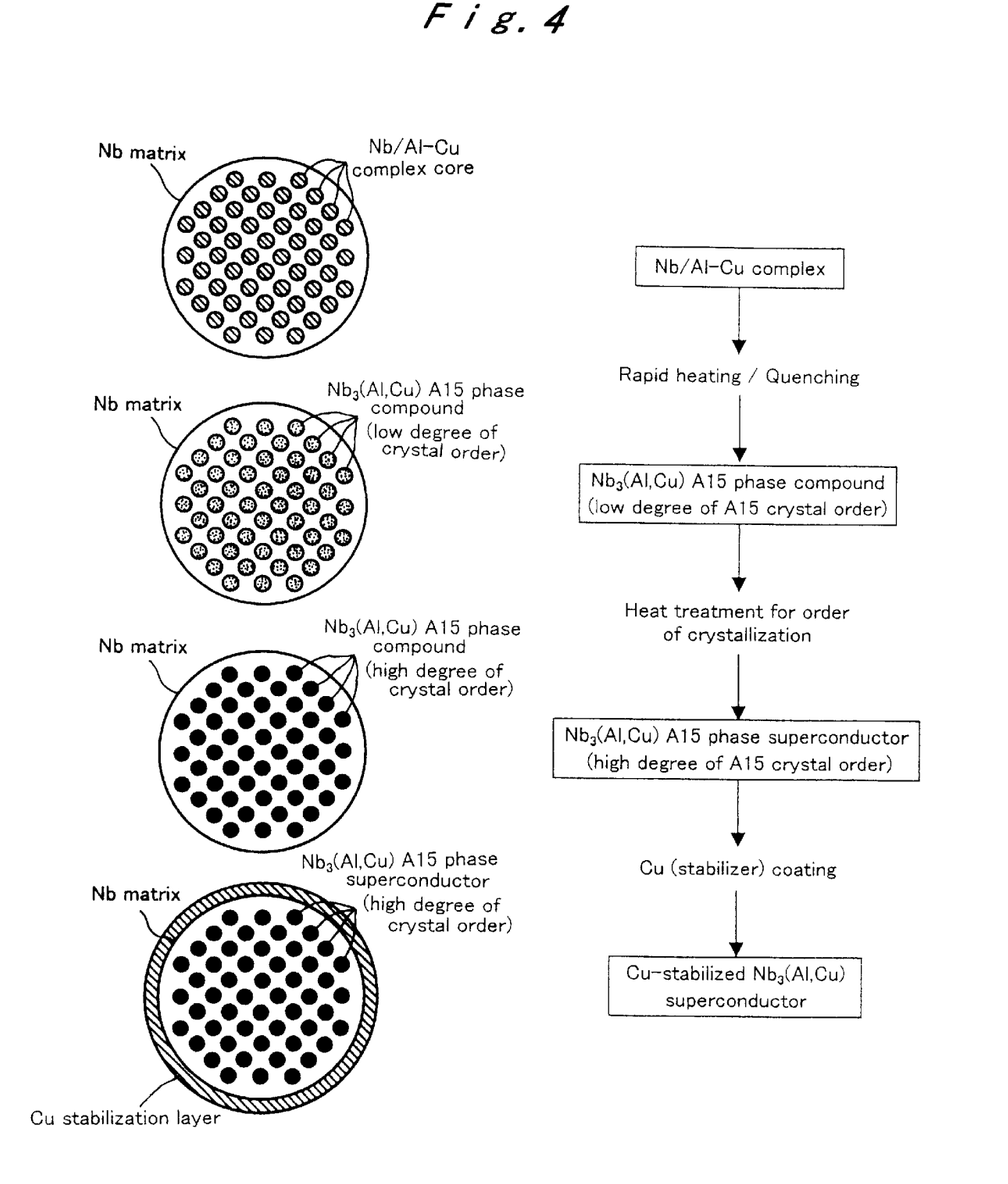
FIG. 4 is a flow chart showing the process of the invention in which Cu for stabilization is coated after additional heat treatment.

As shown in, for example, FIGS. 3 to 5, the invention secures the order of crystallization of the A15 phase compound, making it possible to exhibit the excellent characteristics as a superconductive wire.

The invention is illustrated more specifically by referring to the following Example.

EXAMPLE

Figure 6:
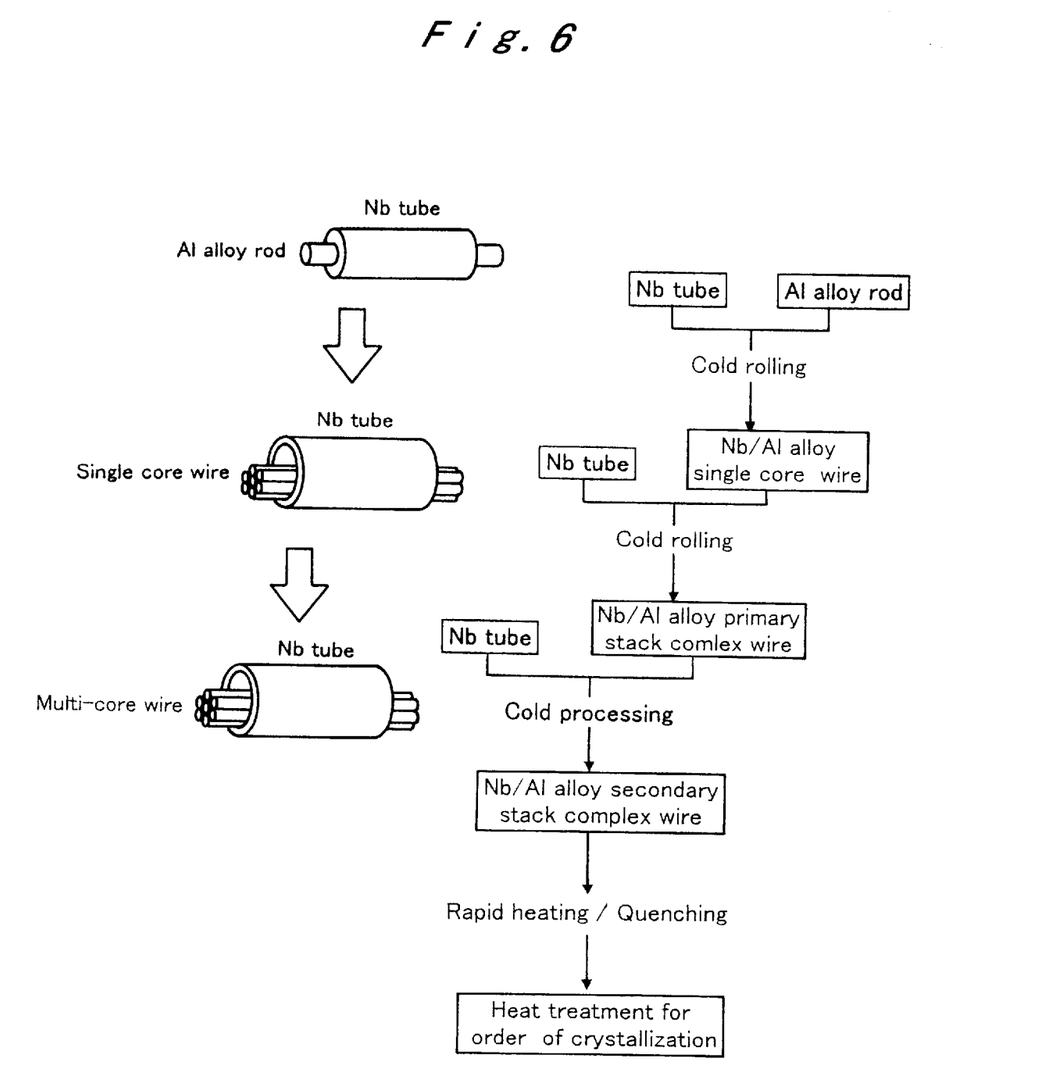
FIG. 6 is a flow chart showing a method 1 of processing an Nb/Al micro-complex core (rod-in-tube method).

<I> To begin with, an Nb/Al—Cu micro-complex core obtained by complexing an Cu—Al alloy in Nb was produced by a rod-in-tube method shown in FIG. 6. The procedures thereof were as follows. First, in the production of the Cu—Al alloy, the amounts of Cu added to the Cu—Al alloy in samples A, B, C and D were A: 0.2 at. %, B: 2 at. %, C: 8 at. % and D: 12 at. %. The respective samples were produced by Tammann melting. Each of these Cu—Al alloys was cut into a rod having an outer diameter of 7 mm, packed in an Nb tube (outer diameter 14 mm, inner diameter 7 mm), and then subjected to cold groove rolling and wire drawing to form a single core wire. However, at this time, wire breakage occurred owing to abnormal deformation in the sample D. Thus, the wire drawing failed, and no single core wire was obtained. When the amount of Cu exceeds 10 at. %, complexing with Nb is difficult, and production of a single core wire is impossible. Regarding the Cu—Al alloys as the other samples A, B and C, these procedures were conducted smoothly, and the three types of the single core wires were obtained.

<II> With respect to the resulting single core wires as the sample A, B and C, a 121×121 core complex (1) and a 330×330 core complex (2) were produced, and micro-complex core samples A1, B1, C1, A2, B2 and C2 were produced. In the production of these micro-complex cores, a part of the single core wires were first drawn to a diameter of 1.14 mm, and the remaining part to a diameter of 0.7 mm. They were cut to an appropriate size. Subsequently, 121 pieces of the cut single core wires having the diameter of 1.14 mm were bundled, and packed in an Nb tube (outer diameter 20 mm, inner diameter 14 mm). The resulting product was subjected to groove rolling and wire drawing to a diameter of 1.14 mm without intermediate annealing, and then cut again to an appropriate length. Further, 121 pieces of the single core wires were bundled, and packed in an Nb tube (outer diameter 20 mm, inner diameter 14 mm) to obtain the 121×121 core complex. Likewise, 330 pieces of the single core wires having the diameter of 0.7 mm were bundled, and packed in an Nb tube (outer diameter 25 mm, inner diameter 16 mm). The resulting product was likewise processed to a diameter of 0.8 mm without intermediate annealing, and then cut again. Further 330 pieces of the single core wires were bundled, and packed in an Nb tube (outer diameter 25 mm, inner diameter 16 mm) to obtain the 330×330 core complex. In this manner, the 121×121 core complex and the 330×330 core complex were processed to a diameter of 0.8 mm by the groove rolling and the wire drawing to give the Nb/Al—Cu micro-complex cores having the multifilamentary (superfine multi-core) structure as the samples A1, B1, C1, A2, B2 and C2. In these samples, the Nb:Al volume ratio was approximately 3:1. With respect to the samples A1 and A2, the wire drawing of the 121×121 core complex as the sample A1 was successfully conducted, but the wire drawing of the 330×330 core complex as the sample A2 failed. This reveals that since the Al alloy is softer than Nb with the addition of 0.2 at. % of Cu, the complexing is not conducted satisfactorily and it is difficult to produce the micro-complex core by the rod-in-tube method.

Figure 7:
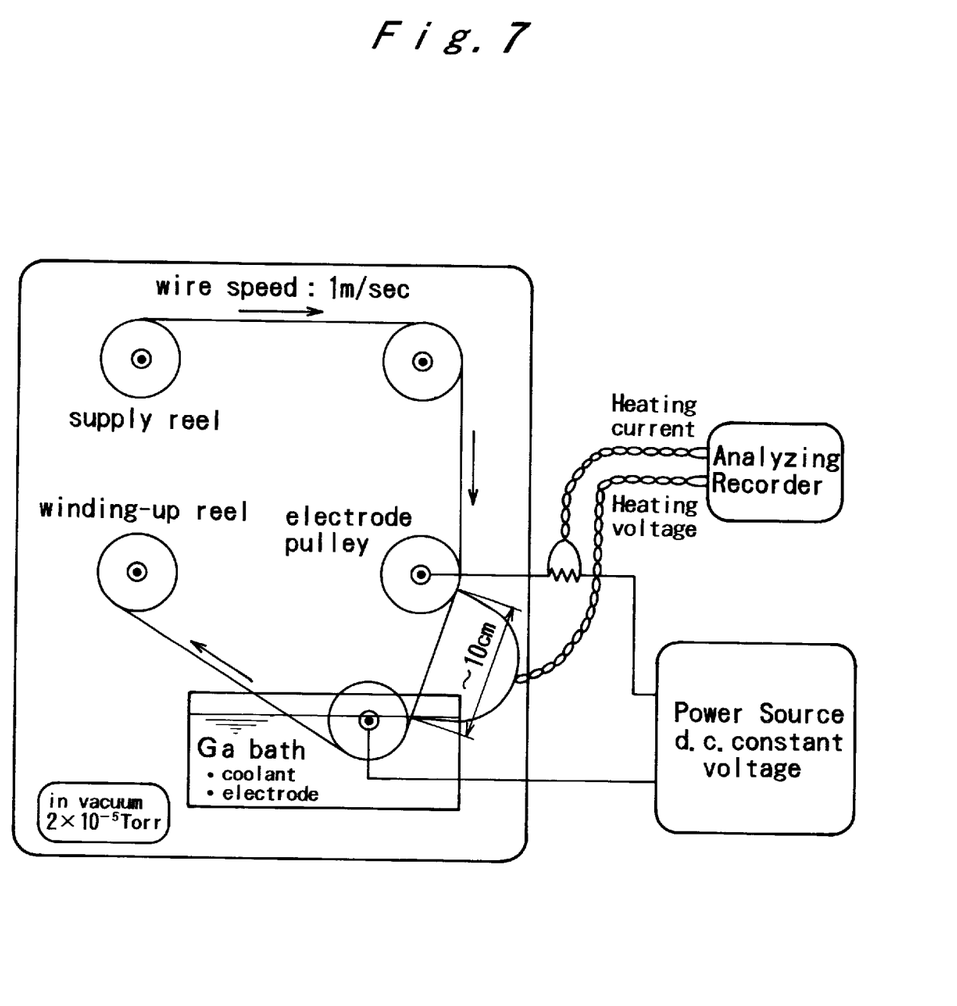
FIG. 7 is a theoretical view of a rapid heating/quenching apparatus.
Figure 8:
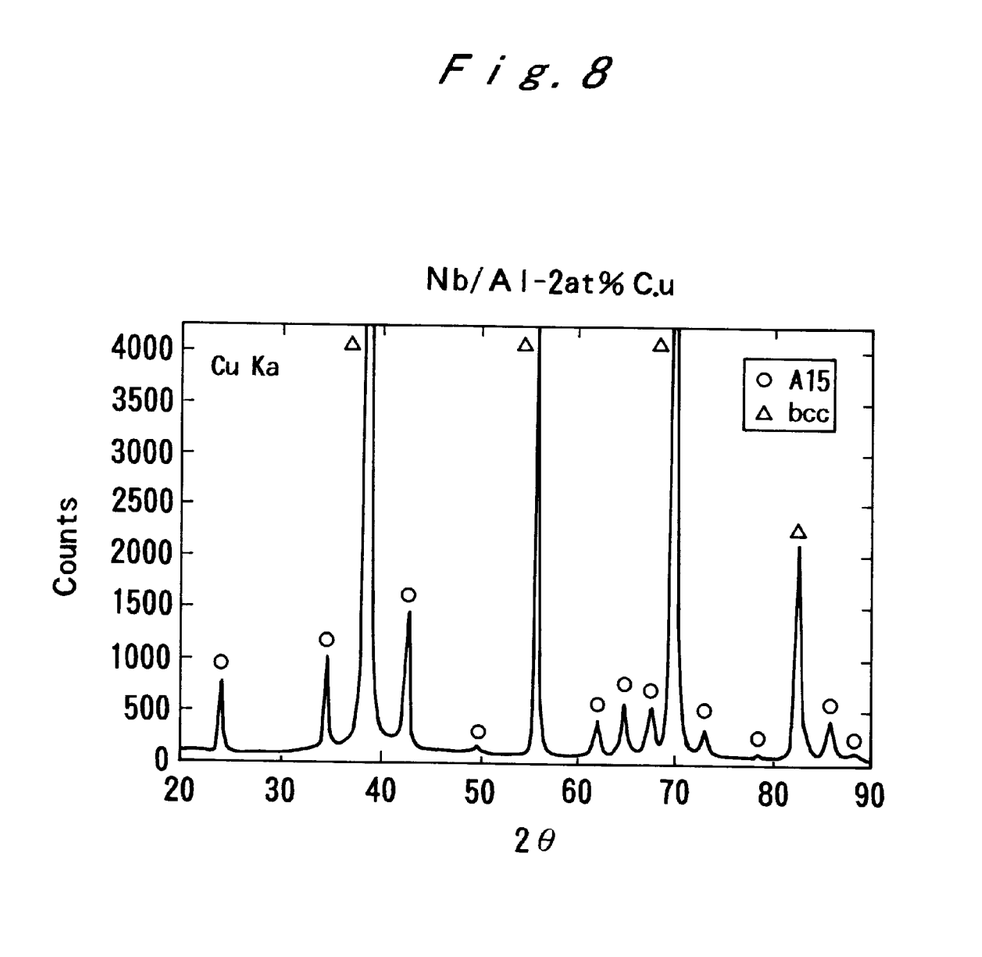
FIG. 8 is an X-ray diffraction pattern of a wire obtained by subjecting an Nb/Al-2 at. % Cu micro-complex core to rapid heating and quenching.

<III> The resulting Nb/Al—Cu micro-complex core was put on a rapid heating/quenching apparatus shown in FIG. 7. In this apparatus, the Nb/Al—Cu micro-complex core was rapidly heated from room temperature to approximately 2,000° C. by passage of a current between an electrode pulley and a Ga bath while being moved at a rate of 1 m/sec. Then, the core was quenched by being passed through the Ga bath held at approximately 50° C. At this time, the rate of quenching was approximately $1 \times 10^{5°}$ C./sec. In this case, the Ga bath acted as an electrode and a coolant. When the Nb/Al—Cu micro-complex core wound up was examined with an X-ray diffractometer, an A15 phase compound filament having a low degree of crystal long-range order was generated (FIG. 8). When an Nb/Al wire free of an additional element such as Cu was rapidly heated and quenched, the result was contrasted with formation of a bcc supersaturation solid solution. However, since the intensity of the diffraction rays from the A15 phase compound was weak in the samples A1 and A2, it was presumed that a bcc supersaturation solid solution was formed to some extent as in using pure Al without the addition of Cu, namely, in using the Nb/Al wire.

<IV> Subsequently, the additional heat treatment was conducted at 650 to 900° C. to produce the Cu-containing $Nb_3Al$ multifilamentary superconductive wire of the invention. Tc of the samples A1 and A2 was 17.9 K which was approximately the same as that in using the Nb/Al wire along with superconductive characteristics such as $Hc_2$ (4.2 K) and Jc (4.2 K).

Figure 9:
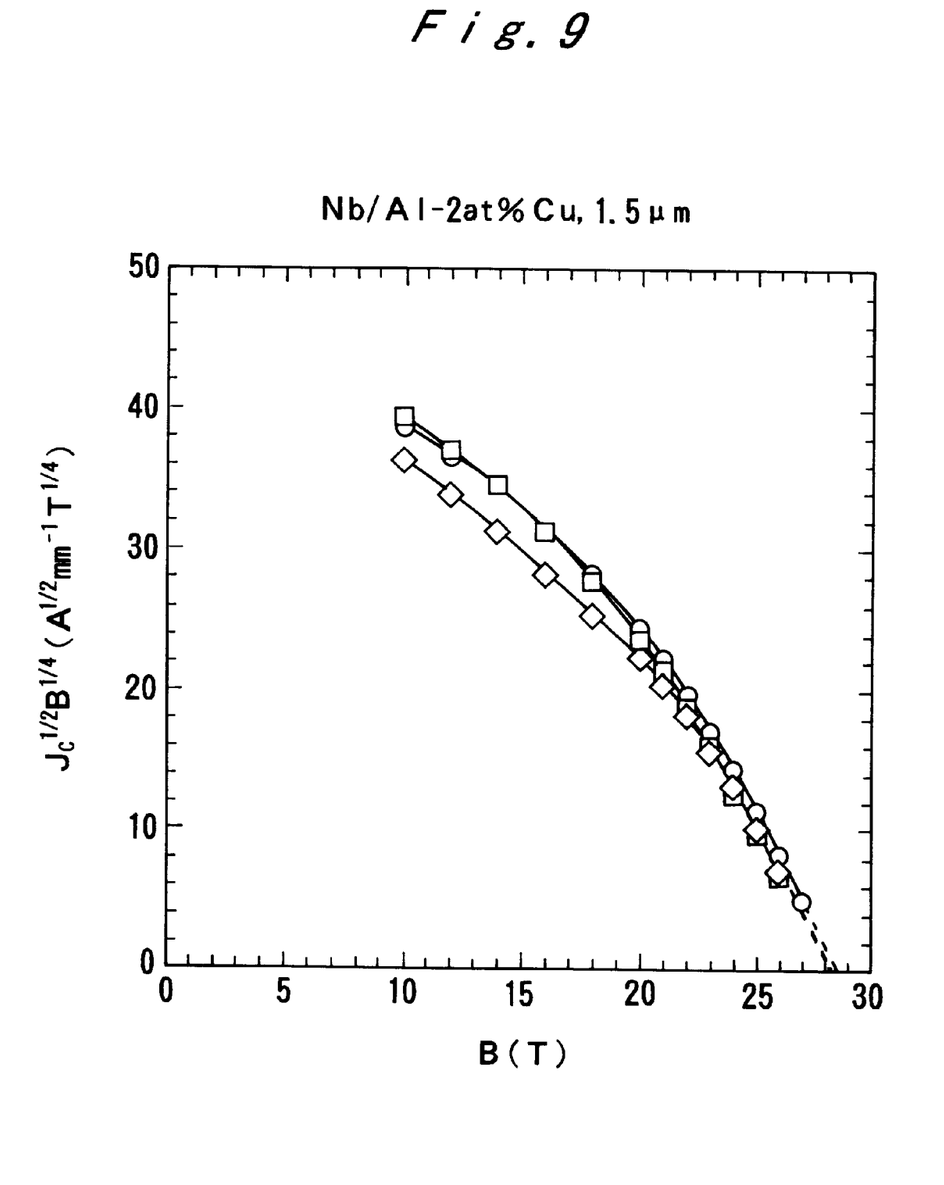
FIG. 9 is a graph showing $Hc_2$ (4.2 K) calculated by extrapolation using a Kramer plot of a high magnetic field Jc (4.2 K).
Figure 10:
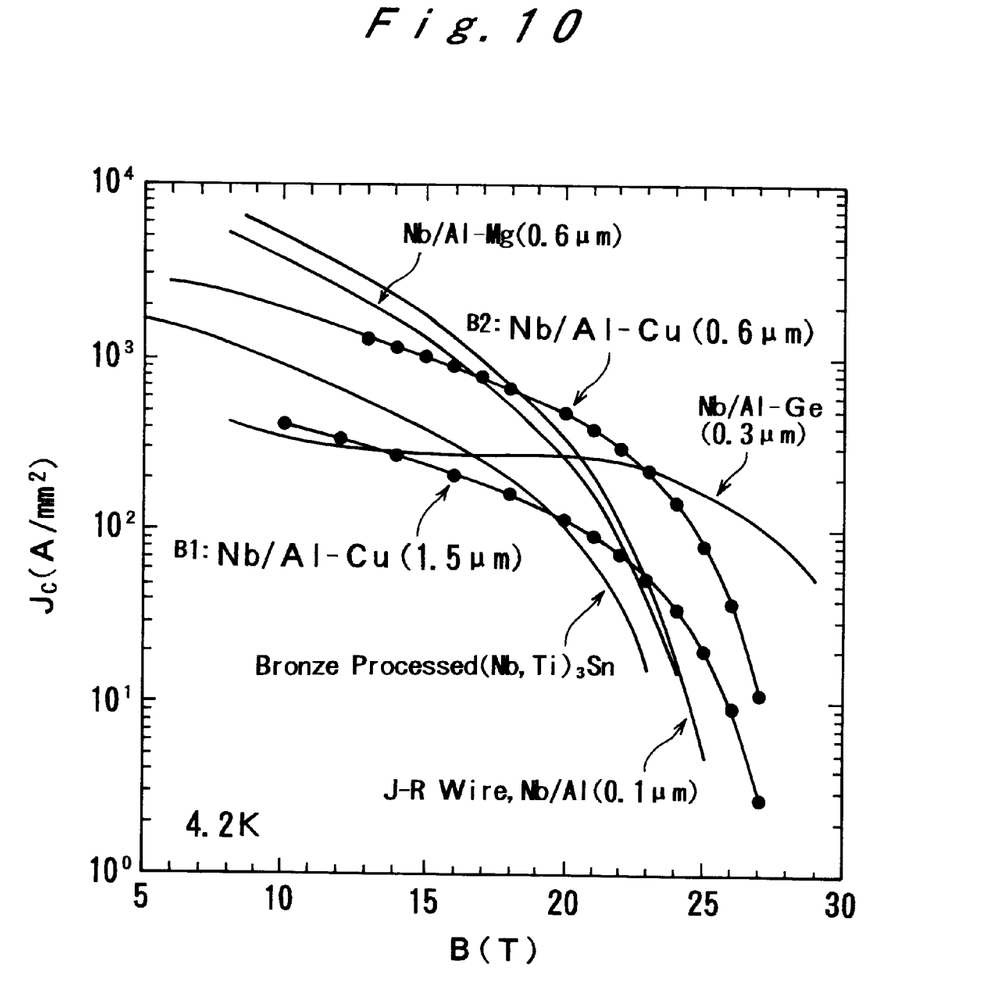
FIG. 10 is a graph showing Jc-B characteristics of NB/Al −2 at. % Cu superconductive wires and actual superconductive wires.

Meanwhile, in the samples B1 and B2, the superconductive characteristics such as Tc, $Hc_2$ (4.2 K) and Jc (4.2 K) were changed before and after the additional heat treatment of the Nb/Al—Cu micro-complex core. Before the treatment, Tc was 13.0 K. However, the additional heat treatment at 750° C. resulted in restoring the degree of crystal long-range order, and Tc was increased up to 18.2 K. Since the higher Tc in using the Nb/Al wire was 17.9 K, it was increased by 0.3 K. Further, $Hc_2$ (4.2 K) was approximately 18 T before the additional heat treatment, but it was increased to between 27 and 28.5 T by the treatment at 700° to 900° C. Since $Hc_2$ (4.2 K) in using the Nb/Al wire was between 25 and 26 T, the addition of Cu resulted in improving the same by approximately 2 T. FIG. 9 shows the $Hc_2$ (4.2 K) characteristics of Nb/Al-2 at. % Cu produced at the three additional heat treatment temperatures. In any of these cases, $Hc_2$ (4.2 K) was improved. Moreover, the Jc-B characteristics were noteworthy. With the addition of Cu, Tc and $Hc_2$ (4.2 K) were improved to some extent, whereas Jc (4.2 K) was far greater than that of existing actual superconductive wires. FIG. 10 shows Jc-B characteristics of the samples B1 and B2 and four actual superconductive wires. A close look at this drawing revealed that the $Nb_3Al$ wire obtained by the rapid heating/quenching and transformation method using the Nb/Al precursor complex wire (produced by the jelly rolling method in which a complex obtained by winding an Nb foil and an Al foil is drawn) showed higher Jc than the samples B1 and B2 in the low magnetic field of 18 T or less. However, a method of utilizing such high Jc has not yet been established in the existing superconduction applied technique. As Jc in the low magnetic field, Jc of the samples B1 and B2 in this Example is said to be satisfactorily in practice. On the other hand, Jc in the high magnetic field is clearly improved with the addition of Cu. Since Jc of the metallic superconductive wire in the high magnetic field tends to become too low indeed, even the slight improvement has a great significance in practice.

Moreover, in the samples C1 and C2, Tc was 18.1 K, and $Hc_2$ (4.2 K) was 28.1 T. These were higher than in using the Nb/Al wire, and the Jc characteristics were also as high as those of the samples B1 and B2.

In any of the wires, the 330×330 micro-complex core (core diameter 0.6 μm) was greatly improved in Jc-B characteristics than the 121×121 micro-complex core (core diameter 1.5 μm). Tc and $Hc_2$ (4.2 K) were improved by only 0.2 to 0.5% even though the core diameter was decreased, whereas the Jc-B characteristics were greatly improved. Further, in this connection, when the thickness of the Al alloy in the micro-complex core was great, Jc (4.2 K) was decreased, and inconvenient results in practice were provided.

<V> Consequently, when the Cu amount was 0.2 at. % or less, the bcc supersaturation solid solution was preferentially formed. In this case, the method was the same as the rapid heating/quenching and transformation method. Further, when the Cu amount was 0.2 at. % or less or exceeded 10 at. %, complexing with Nb became difficult and the complex wire of the precursor could not be produced. However, the addition of Cu in the range of more than 0.2 at. % and at most 10 at. % greatly improved the wire drawing property and increased the yield of the micro-complex core. Thus, the wire production cost can be cut down.

Further, when the thickness of the Al alloy in the microcomplex core was great, Jc (4.2 K) was decreased, and inconvenient results in practice were provided.

Figure 11:
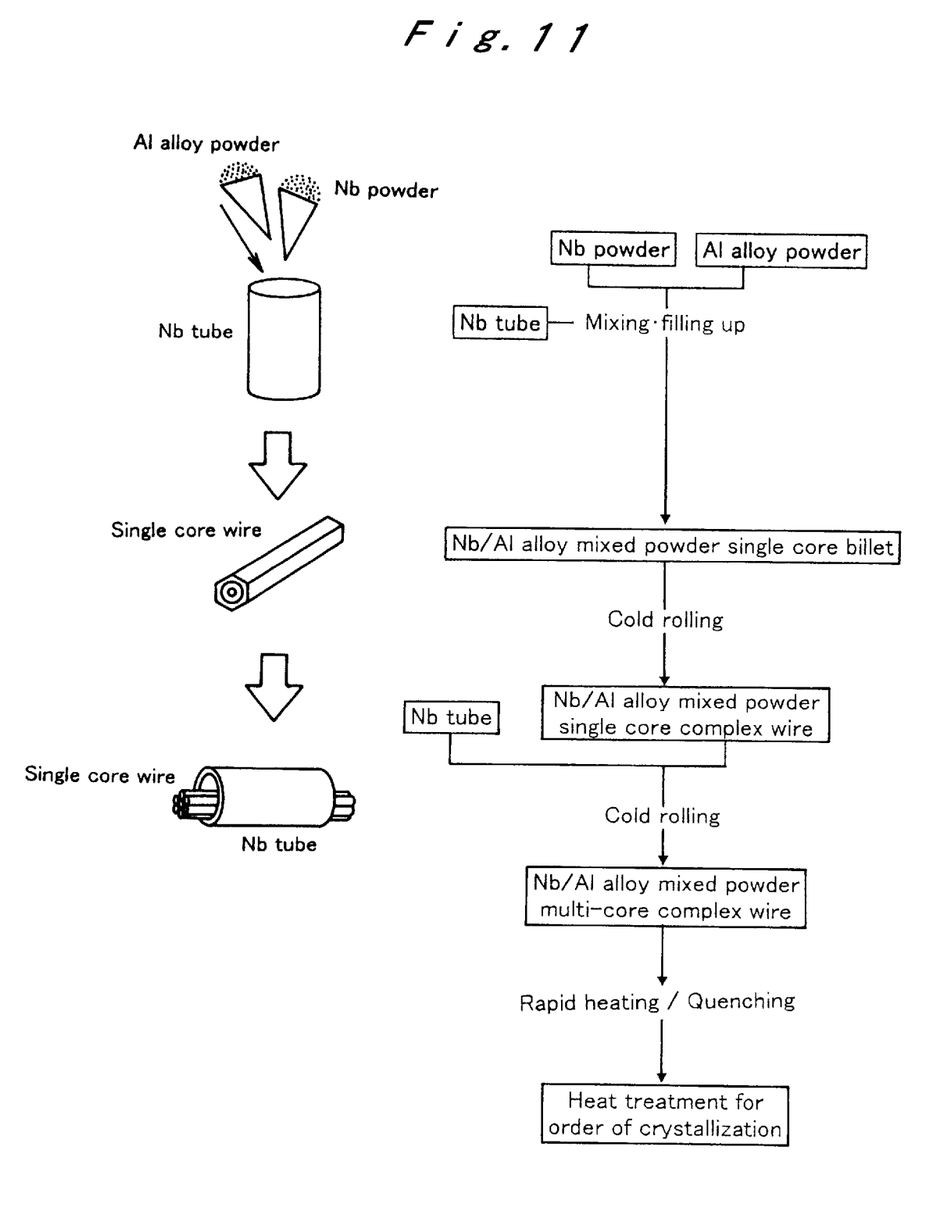
FIG. 11 is a flow chart showing a method 2 of processing an Nb/Al micro-complex core (powder-in-tube method).
Figure 12:
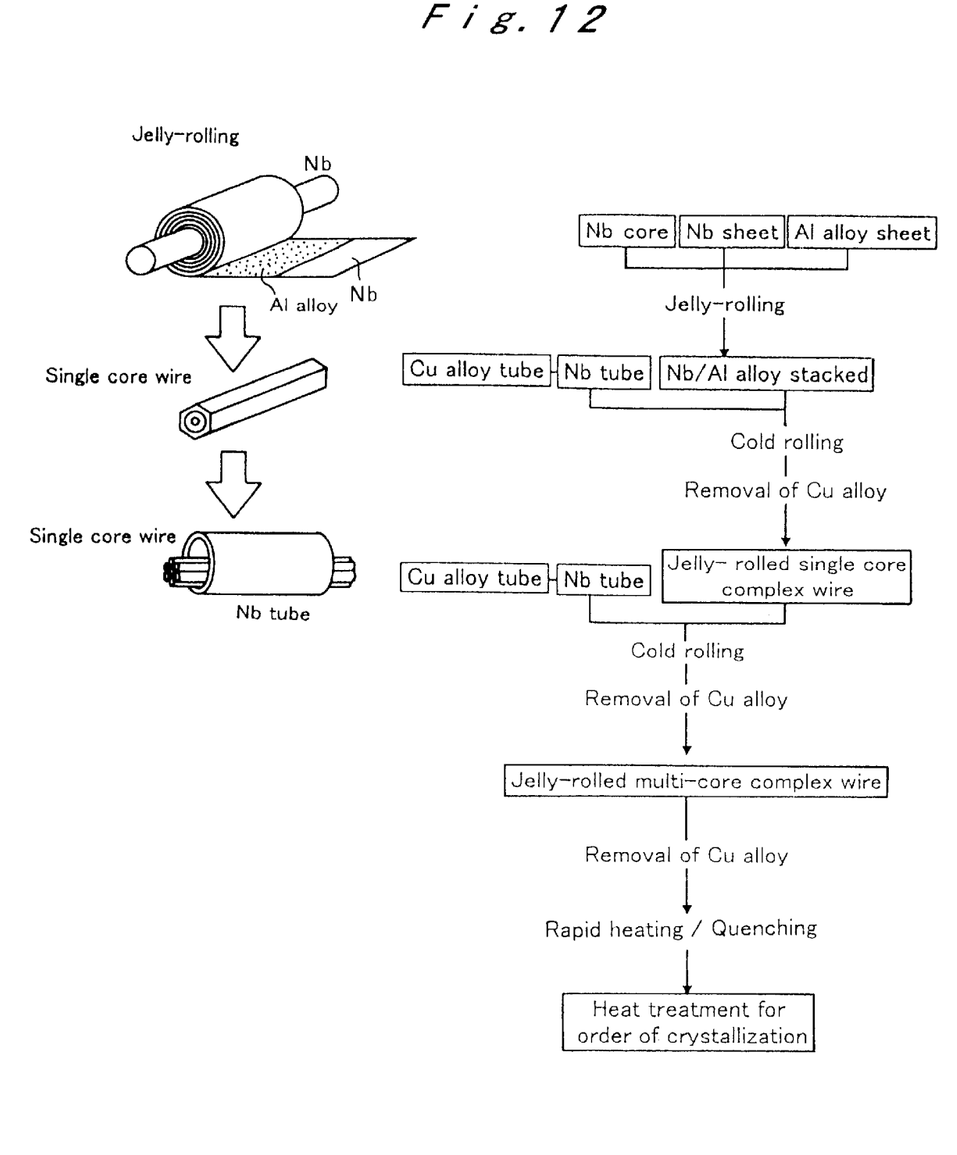
FIG. 12 is a flow chart showing a method 3 of processing an Nb/Al micro-complex core (jelly-rolling method).
Figure 13:
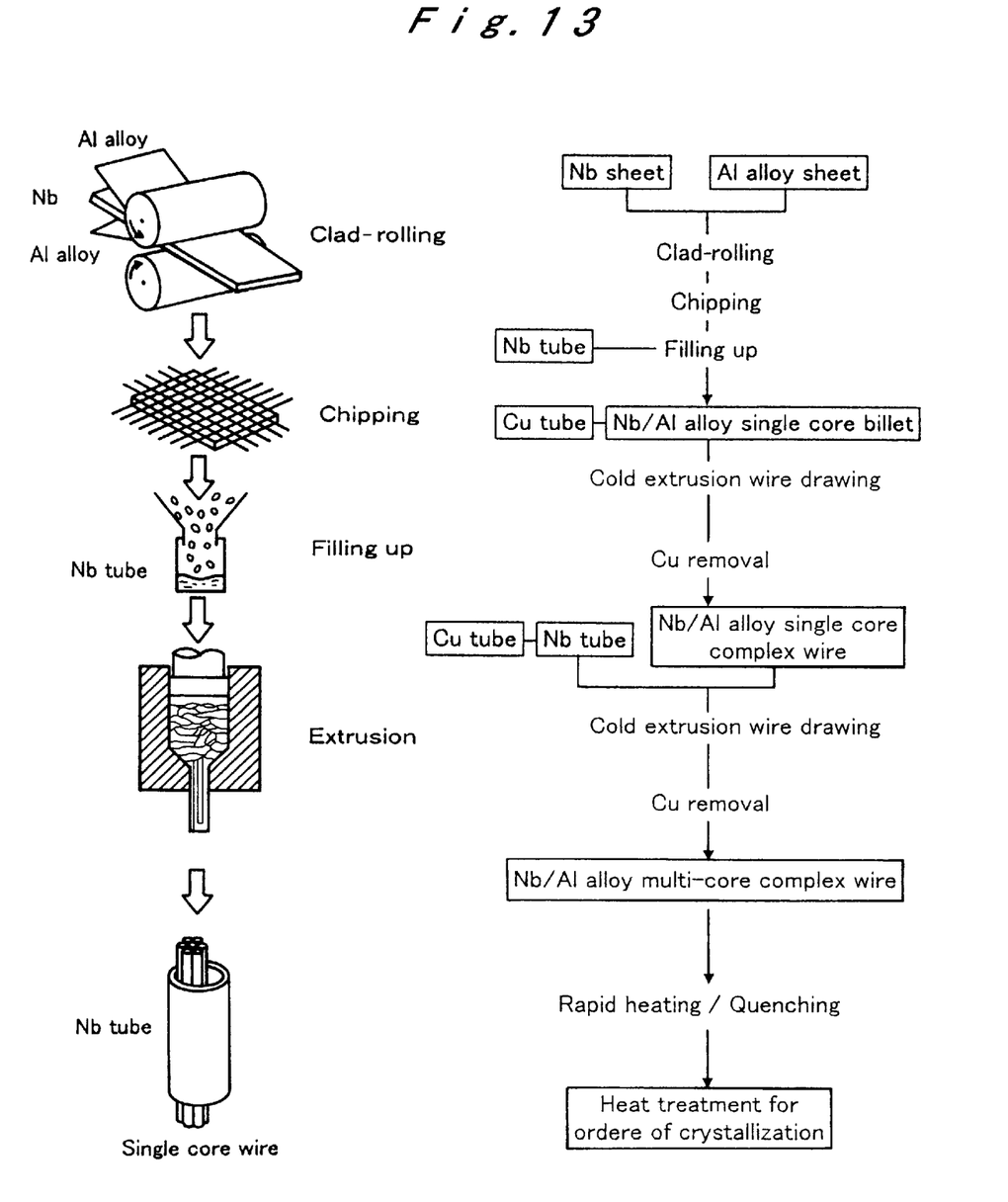
FIG. 13 is a flow chart showing a method 4 of processing an Nb/Al micro-complex core (clad-chip-extrusion method).

<VI> In this Example, the Cu—Al alloy core was inserted into the Nb tube, and the wire drawing and the complexing were repeated to produce the Nb/Al-Cumicro-complex core. However, besides this method, the characteristics are considered to be unchanged in theory in a powder-in-tube method in which a mixture of an Nb powder and an Al alloy powder is drawn (FIG. 11), a jelly-rolling method in which a complex obtained by overlaying an Nb sheet and an Al alloy sheet in the form of a roll and winding up the same is drawn (FIG. 12) and a clad-chip-extrusion method in which an Al alloy sheet and an Nb sheet are overlaid, slightly processed, and then cut into appropriate rectangular chips which are extruded to form a micro-complex core (FIG. 13).

Moreover, in this Example, the Nb/Al alloy ratio of the micro-complex core was set at 3:1. However, in practice, the ratio may be somewhat deviated from this value. For example, a range of 2.5:1 to 3.5:1 is also available. However, when the ratio is greatly deviated, proportions of other non-superconductive compounds or non-superconductive alloys are increased. Thus, it is unwanted.

In addition, the rapid heating/quenching of the wire in this Example was conducted at the moving rate of 1 m/sec, and the heating time in this case was 0.1 second. However, even when the moving rate of the wire was decreased to 0.5 m/sec and 0.2 m/sec, the resulting superconductive characteristics remained almost unchanged. However, when the moving rate of the wire was changed to less than 0.05 m/sec, the amount of Nb eluted in the Ga bath was increased, and it was not suited for rapid heating/quenching of a long wire. Thus, it is preferable that the rapid heating is conducted for 2 seconds or less. Of course, with respect to the procedures of rapid heating and quenching, the method using the Ga bath as shown in FIG. 7 is not critical, and various methods are available.

In this example, pure Nb was used as the matrix. This is because it can endure the temperature of 1,700° C. or more, the satisfactory cold-rolling property is important and a poor diffusion reactivity with $Nb_3Al$ is required. As the matrix having such requirements, Ta, an Nb alloy and a Ta alloy are considered besides Nb. The Nb alloy and the Ta alloy are similar in plastic working property. The cost of the Ta alloy is overwhelmingly high. However, since the melting point of the Ta alloy is high, the mechanical strength is increased in rapid heating and quenching. Thus, the amount of the matrix can be reduced. When the ratio of the matrix to the micro-complex core is zero, the multifilamentary (superfine multi-core) structure cannot be maintained, and the superconductive state becomes unstable. Thus, the ratio of the matrix cannot be zero in view of the superconductive characteristics. Yet, it is advisable that the ratio is reduced to approximately 0.2. In case of using the Nb alloy, the wire with the ratio of the matrix reduced to 0.4 is successfully produced. Meanwhile, it is considered that the ratio of the matrix can be reduced to 0.2 when using the Ta alloy. In this instance, when the superconductive characteristics of the filament portion are unchanged, the superconductive current capacity can be improved by (1+0.4)/(1+0.2). Preferable examples of the Nb alloy and the Ta alloy as the matrix include Nb—V, Nb—Cr, Nb—Mo, Nb—Mn, Nb—Ta, Nb—Ti, Nb—Zr, Ta—V, Ta—Cr, Ta—Mo, Ta—Mn, Ta—Nb, Ta—Ti and Ta—Zr. The amount of the additional element based on the main phase in the respective alloys is preferably 10 at. % or less in view of not impairing the cold-rolling property.

The invention is naturally not limited to this Example, and it goes without saying that various modifications are possible.

As has been stated in detail above, the invention provides the process for producing the $Nb_3Al$ multifilamentary superconductive wire excellent in characteristics in the high magnetic field. Further, the process of the invention can eliminate the defect that Jc is low in the low magnetic field and be applied to generation of all magnetic fields of 29 T or less. Thus, an economical superhigh magnetic field superconductive wire with simple designing can be realized.

What is claimed is:

1. A Cu-containing $Nb_3Al$ multifilamentary superconductive wire having a multifilamentary (superfine multi-core) structure that a large number of micro-complex cores each obtained by complexing a Cu—Al alloy containing Cu in an amount of more than 0.2 at. % and at most 10 at. % in Nb are embedded in Nb, Ta, an Nb alloy or a Ta alloy as a matrix, wherein in the micro-complex cores, an A15 phase compound structure is formed by rapid heating at a temperature of 1,700° C. or more for 2 seconds or less and quenching to approximately room temperature, and further additionally heat-treated at a temperature of 650 to 900° C.

2. The Cu-containing $Nb_3Al$ multifilamentary superconductive wire as claimed in claim 1, wherein in the micro-complex cores, the Cu—Al alloy complexed in Nb has an average diameter of 1 $\mu$ or less.

3. The Cu-containing $Nb_3Al$ multifilamentary superconductive wire as claimed in claim 1, wherein in the micro-complex cores, the Cu—Al alloy complexed in Nb has a volume ratio to Nb of 1:2.5 to 1:3.5 in terms of a Cu—Al alloy:Nb ratio.

4. The Cu-containing $Nb_3Al$ multifilamentary superconductive wire as claimed in claim 1, wherein Cu for stabilization is coated as an outermost layer.

5. The Cu-containing $Nb_3Al$ multifilamentary superconductive wire as claimed in claim 1, wherein Cu for stabilization surrounded by a diffusion barrier layer made of Nb or Ta is mounted in the matrix.

6. A process for producing the Cu-containing $Nb_3Al$ multifilamentary superconductive wire as claimed in claim 1, wherein the wire having the multifilamentary (superfine multi-core) structure is made to have a temperature of 1,700° C. or more by rapid heating for 2 seconds or less, then quenched to approximately room temperature and thereafter additionally heat-treated at a temperature of 650 to 900° C.

7. The process for producing the Cu-containing $Nb_3Al$ multifilamentary superconductive wire as claimed in claim 6, wherein before or after the additional heat treatment, Cu for stabilization is coated on the surface of the wire.

8. The process for producing the Cu-containing $Nb_3Al$ multifilamentary superconductive wire as claimed in claim 6, wherein before the rapid heating, Cu for stabilization surrounded by a diffusion barrier layer made of Nb or Ta is mounted in the matrix.

* * * * *